US007867807B2

(12) United States Patent
Kishita et al.

(10) Patent No.: US 7,867,807 B2
(45) Date of Patent: Jan. 11, 2011

(54) METHOD FOR MANUFACTURING PHOTOELECTRIC CONVERTING DEVICE

(75) Inventors: Hitoshi Kishita, Hamamatsu (JP); Hiroyuki Sugiyama, Hamamatsu (JP); Hiroyuki Kyushima, Hamamatsu (JP); Hideki Shimoi, Hamamatsu (JP); Keisuke Inoue, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 170 days.

(21) Appl. No.: 12/161,890

(22) PCT Filed: Feb. 28, 2007

(86) PCT No.: PCT/JP2007/053805

§ 371 (c)(1), (2), (4) Date: Aug. 11, 2008

(87) PCT Pub. No.: WO2007/111072

PCT Pub. Date: Oct. 4, 2007

(65) Prior Publication Data

US 2009/0305450 A1 Dec. 10, 2009

(30) Foreign Application Priority Data

Mar. 29, 2006 (JP) ........................... P2006-091476

(51) Int. Cl.
*H01L 21/00* (2006.01)

(52) U.S. Cl. ................. 438/64; 257/E21.499; 313/532; 313/541

(58) Field of Classification Search ................... 438/34, 438/64; 313/532, 533, 536, 541, 542; 427/74; 257/E21.499
See application file for complete search history.

(56) References Cited

U.S. PATENT DOCUMENTS

| | | | |
|---|---|---|---|
| 5,264,693 A | 11/1993 | Shimabukuro et al. | |
| 5,329,110 A | 7/1994 | Shimabukuro et al. | |
| 7,049,747 B1 | 5/2006 | Goodberlet et al. | |
| 7,294,954 B2 | 11/2007 | Syms | |
| 2002/0180342 A1 | 12/2002 | Yamada et al. | |
| 2007/0194713 A1 * | 8/2007 | Kyushima et al. | 313/532 |

FOREIGN PATENT DOCUMENTS

| | | |
|---|---|---|
| JP | 10-241622 | 9/1998 |
| JP | 2000-149791 | 5/2000 |
| JP | 2000-311641 | 11/2000 |

(Continued)

*Primary Examiner*—Brook Kebede
(74) *Attorney, Agent, or Firm*—Drinker Biddle & Reath LLP

(57) ABSTRACT

The present invention relates to a manufacturing method of obtaining a photoelectric converting device which can sufficiently maintain airtightness of a housing space for photocathode without degradation of the characteristics of the photocathode. In accordance with the manufacturing method, on the side wall end face of a lower frame and a bonding portion of an upper frame forming an envelope of the photoelectric converting device, a multilayered metal film of chromium and nickel is formed. In a vacuum space decompressed to a predetermined degree of vacuum and having a temperature not more than the melting point of indium, these upper and lower frames introduced therein are brought into close contact with each other with a predetermined pressure while sandwiching indium wire members, and accordingly, an envelope having a housing space whose airtightness is sufficiently maintained is obtained.

6 Claims, 8 Drawing Sheets

FOREIGN PATENT DOCUMENTS

| | | | |
|---|---|---|---|
| JP | 2001-210258 | | 8/2001 |
| JP | 2002050939 | A * | 2/2002 |
| JP | 2003-151476 | | 5/2003 |
| JP | 2003-531475 | | 10/2003 |
| JP | 2005-79536 | | 3/2005 |
| JP | 2005-190790 | | 7/2005 |
| WO | 2005/078760 | | 8/2005 |

* cited by examiner (a)

*Fig.8*

| | UPPER FRAME MATERIAL | UPPER MULTILAYERED METAL FILM | BONDING MATERIAL | LOWER MULTILAYERED METAL FILM | LOWER FRAME MATERIAL | NON-DEFECTIVE RATE |
|---|---|---|---|---|---|---|
| SAMPLE 1 | GLASS | Cr(50),Ni(500) | In WIRE | Cr(50),Ni(500) | GLASS | 6/6 |
| SAMPLE 2 | GLASS | Ti(300) | In WIRE | Ti(300) | GLASS | 2/2 |
| SAMPLE 3 | GLASS | Cr(50),Ni(500) | In WIRE | Cr(50),Ni(500) | SILICON | 2/2 |
| SAMPLE 4 | GLASS | Cr(300),Ti(30) | In WIRE | Cr(300),Ti(30) | GLASS | 3/3 |
| SAMPLE 5 | GLASS | Cr(300),Ni(500) | In WIRE | Cr(300),Ni(500) | SILICON | 10/10 |
| COMPARATIVE EXAMPLE 1 | GLASS | Ti(30),Pt(20),Au(1000) | In WIRE | Ti(30),Pt(20),Au(1000) | GLASS | 0/6 |
| COMPARATIVE EXAMPLE 2 | GLASS | | In WIRE | | GLASS | 0/4 |

METHOD FOR MANUFACTURING PHOTOELECTRIC CONVERTING DEVICE

TECHNICAL FIELD

The present invention relates to a method of manufacturing a photoelectric converting device which generates photoelectrons in response to incidence of light from outside.

BACKGROUND ART

As an electronic device which functions as an optical sensor, photoelectric converting devices such as photomultiplier tubes (PMT) are conventionally known. These photoelectric converting devices have at least a photocathode for converting light into electrons, an anode for taking-in the generated electrons, and a vacuum vessel (envelope) which houses the photocathode and anode in an internal space thereof. As such a photoelectric converting device, a photomultiplier tube which comprises an envelope constituted by an upper and lower frames each comprised of glass and a side frame comprised of silicon material, and which comprises a photocathode, an electron multiplier section, and an anode arranged in the internal space of the envelope is known (refer to Patent document 1 listed below). In addition, an electron tube, which has an anode electrode arranged inside a vacuum vessel which includes a glass-made faceplate having a photocathode formed on an inner side thereof and a metal-made side tube and which is constituted by sealing the faceplate and the side tubes via a low-melting point metal, is also disclosed (refer to Patent document 2 listed below).

Patent document 1: Pamphlet of International Patent Publication No. WO2005/078760

Patent Document 2: Japanese Patent Application Laid-Open No. 10-241622

DISCLOSURE OF THE INVENTION

Problems that the Invention is to Solve

The inventors have studied the foregoing prior art in detail, and as a result, have found problems as follows. Namely, conventional photoelectric converting devices are influenced by the environmental temperature in a step of bonding the members constituting the vacuum vessel, and as a result, the vacuum vessel may be distorted by a difference in thermal expansion coefficient between each of the members. When such a distortion occurred, it became difficult to maintain the airtightness inside the vacuum vessel, and degradation of the characteristics of the photocathode resulted. On the other hand, in accordance with a cold indium method in which members of the vacuum vessel were bonded to each other via indium at a temperature not more than the melting point of indium, the characteristics of the photocathode can be maintained, however, depending on the material of the vacuum vessel, harmonization to the bonding material such as indium becomes insufficient. In this case, the bonding between the members is not perfect and the sealing of the vacuum vessel cannot be sufficiently maintained.

The present invention is made to solve the aforementioned problem, and it is an object to provide a method of manufacturing a photoelectric converting device which can sufficiently maintain the airtightness of a housing space for photocathode without degradation of the characteristics of the photocathode.

Means for Solving the Problems

In order to solve the above-described problem, a method of manufacturing a photoelectric converting device according to the present invention is characterized by bonding between members of an envelope having an internal space for housing a photocathode, etc. The photoelectric converting device, manufactured according to this manufacturing method, comprises an envelope having an internal space whose inside is decompressed to a predetermined degree of vacuum and has a light entrance window at least at a part thereof, and comprises a photocathode and an anode which are housed in the internal space of the envelope. The envelope comprises a first frame and a second frame to be bonded to the first frame. The first frame comprises a tabular member and a side wall provided on a main surface of the tabular member so as to surround the center of the main surface and extends along a vertical direction (direction from the first frame to the second frame in a state where the first frame and the second frame face each other). The second frame comprises a tabular member (this second frame may also be provided with a side wall). Therefore, the internal space of the envelope housing at least a photocathode and an anode is defined by the main surface of the tabular member of the first frame, the side wall of the first frame, and the main surface of the tabular member of the second frame.

The manufacturing method according to the present invention, in order to manufacture a photoelectric converting device having the above-described structure, comprises a first step of forming a first metal film on the end face of a side wall of a first frame facing the main surface of a tabular member of a second frame, a second step of forming a second metal film directly or indirectly on a bonding portion on the surface of the tabular member of the second frame facing the side wall end face of the first frame, a third step of arranging the photocathode and the anode inside an internal space of an envelope, a fourth step of introducing the first and second frames into a vacuum space (for example, into a vacuum transfer apparatus into which first and second frames are introduced) at a temperature not more than the melting point of indium, decompressed to a predetermined degree of vacuum, and a fifth step of bonding the first frame and the second frame inside the vacuum space.

In the first step, the first metal film, to be formed on the side wall end face of the first frame, includes one of a metal film in which chromium and nickel are laminated in order along a vertical direction (direction from the first frame to the second frame in a state where the first frame and the second frame face each other) from the side wall end face, a metal film in which chromium and titanium are laminated in order along the vertical direction from the side wall end face, and a metal film comprised of titanium. In the second step, the second metal film, to be formed directly or indirectly on a bonding portion on the surface of the tabular member of the second frame, includes one of a metal film in which chromium and nickel are laminated in order along a vertical direction (direction from the second frame to the first frame in a state where the first frame and the second frame face each other) from the tabular member surface, a metal film in which chromium and titanium are laminated in order along the vertical direction from the tabular member surface, and a metal film comprised of titanium. However, in a construction in which the bonding portion of the second frame is provided with a side wall, the second metal film cannot be directly formed on the bonding portion. In this case, by forming the second metal film on the end face of the side wall provided on the second frame, the second metal film is formed indirectly on the bonding portion.

In the third step, the photocathode and the anode are formed on at least either the main surface of the tabular member of the first frame or the main surface of the tabular member of the second frame, respectively. In the fourth step, regarding the first and second frames introduced in the vacuum space, the side wall end face of the first frame and bonding portion of the second frame face each other in a state where a bonding material containing indium is sandwiched between the first metal film and the second metal film. Then, in the fifth step, the first and second frames made to face each other are brought into close contact with each other with a predetermined pressure while sandwiching the bonding material and bonded to each other.

As described above, the first metal film, to be formed on the side wall end face of the first frame, is a multilayered metal film comprising a chromium layer formed directly on the end face and a nickel layer or titanium layer formed on the chromium layer, or a single-layer metal film of a titanium layer. On the other hand, the second metal film, to be formed directly or indirectly on the bonding portion of the second frame (portion facing the side wall end face of the first frame), is a multilayered metal film having the same composition as that of the first metal film, or a titanium metal film. After a photocathode and an anode are arranged in the space defined by the first and second frames, these first and second frames are bonded to each other in a vacuum space that has been decompressed to a predetermined degree of vacuum and is at a temperature not more than the melting point of indium. In accordance with the manufacturing method, the adhesion between the first frame and the second frame via a bonding material without depending on the constituting materials of the first frame and the second frame is improved, and distortion of the envelope caused by a temperature when bonding can be effectively restrained. Therefore, airtightness of the internal space of the envelope constituting the photoelectric converting device is sufficiently maintained. At the same time, characteristic degradation of the photocathode due to heating can also be effectively prevented.

In the manufacturing method according to the present invention, it is preferable that at least one of the tabular member of the first frame and the tabular member of the second frame are comprised of glass material, and a part thereof functions as a light entrance window. The tabular member comprised of glass material is thus prepared, so that the light entrance window is easily formed. Further, the harmonization between the tabular member and the multilayered metal film is excellent, so that the airtightness of the internal space of the envelope can be further improved.

In this manufacturing method according to the present invention, the side wall of the first frame is preferably comprised of silicon material. In this case, the side wall is easily processed. In addition, the adhesion between the tabular member constituting a part of the first frame and the multilayered metal film is excellent, so that the airtightness of the internal space of the envelope can be further improved.

Furthermore, in the manufacturing method according to the present invention, it is preferable that the tabular member of the first frame is comprised of glass material and this glass-made tabular member and the side wall is anodically bonded. Due to this construction, manufacturing of the first frame becomes easy, and the influence of heat on the first frame at the time of manufacturing can be effectively reduced.

On the other hand, the method of manufacturing a photoelectric converting device according to the present invention may have a structure suitable for mass production. In other words, the manufacturing method comprises a first step of forming a plurality of frame structures having the same structure as that of the first frame on a first substrate, a second step of forming a plurality of frame structures having the same structure as that of the second frame on a second substrate, a third step of arranging a plurality of pairs of photocathodes and anodes inside internal spaces of associated envelopes, a fourth step of introducing the first and second substrates into a vacuum space decompressed to a predetermined degree of vacuum (for example, into a vacuum transfer apparatus) and is at a temperature not more than the melting point of indium, a fifth step of bonding the first substrate and the second substrate in the vacuum space, and a sixth step of obtaining a plurality of envelopes from the first and second substrates bonded to each other.

In the first step, the first substrate is prepared and first frame structures are made on the first substrate. In other words, a plurality of side walls are formed so as to surround a plurality of divided regions allocated on the surface of the prepared first substrate, and on the end faces of the plurality of side walls, a first metal film is formed. Herein, the plurality of side walls extend along a first direction extending vertically from the first substrate surface, and are formed on the surface of the first substrate. The first metal film includes one of a metal film in which chromium and nickel are laminated in order along the first direction, a metal film in which chromium and titanium are laminated in order along the first direction, and a metal film comprised of titanium. In the second step, the second substrate is prepared, and on each of a plurality of bonding portions on the surface of the second substrate which should face the end faces of the plurality of side walls formed on the surface of the first substrate, the second metal film is formed directly or indirectly on each of the bonding portions on the surface of the second substrate. The second metal film includes one of a metal film in which chromium and nickel are laminated in order along a second direction (opposite to the first direction) extending vertically from the surface of the second substrate, a metal film in which chromium and titanium are laminated in order along the second direction, and a metal film comprised of titanium. However, in a construction in which a plurality of side walls are also provided on the plurality of bonding portions on the surface of the second substrate, the second metal film cannot be formed directly, on each of the bonding portions. In this case, by forming the second metal film on the end faces of the plurality of side walls provided on the second substrate, the second metal film is formed indirectly on each of the bonding portions. In the third step, a plurality of pairs of photocathodes and anodes are formed on at least one of associated regions on the surface of the first substrate and associated regions on the surface of the second substrate. In the fourth step, while sandwiching a bonding material containing indium between the first metal film and the second metal film, end faces of the plurality of side walls on the first substrate surface and the plurality of bonding portions on the second substrate surface face each other. In the fifth step, while sandwiching the bonding material, the first substrate and the second substrate are brought into close contact with each other with a predetermined pressure. Then, in the sixth step, the first and second substrates bonded to each other are diced along the plurality of side walls positioned between the first and second substrates, whereby a plurality of photoelectric converting devices are obtained.

As described above, the first metal film, to be formed on the end faces of the plurality of side walls on the surface of the first substrate, is a multilayered metal film comprising a chromium layer formed directly on the end faces and a nickel layer or a titanium layer formed on the chromium layer, or a single-layer metal film of a titanium layer. On the other hand, the second metal film, to be formed directly or indirectly on the plurality of bonding portions (portions facing the end faces of the side walls of the first substrate) on the surface of the second substrate, is a multilayered metal film having the same composition as that of the first metal film or a titanium metal film. After the photocathodes and anodes are arranged in a space corresponding to the internal space of an envelope formed between the first and second substrates, these first and second substrates are bonded to each other inside a vacuum space (for example, vacuum transfer apparatus) that has been decompressed to a predetermined degree of vacuum and is at a temperature not more than the melting point of indium. In this manufacturing method, by dicing the pressure-bonded first and second substrates integrally along the plurality of side walls, a plurality of photoelectric converting devices are obtained. In accordance with this manufacturing method, the adhesion between the first substrate and the second substrate via a bonding material is improved regardless of the materials of the first and second substrates. As a result, by dicing, a plurality of envelopes having sufficiently maintained airtightness of the internal space are obtained. In addition, distortion of the envelopes caused by the bonding temperature can be effectively restrained. Therefore, characteristic degradation of the photocathode due to heating can also be effectively prevented.

Further, in the manufacturing method according to the present invention, the first step may include a sub-step of preparing a third substrate and forming a plurality of side walls on the third substrate. In detail, at this sub-step, the third substrate is etched into patterns serving as a plurality of side walls. Thereafter, the thus etched third substrate is anodically bonded to the first substrate in a manner that each of the plurality of side walls formed thereon surround a plurality of divided regions allocated on the surface of the first substrate. In this case, manufacturing of the first substrate becomes easy, and the influence from heat at the time of manufacturing the first substrate with side walls can be effectively reduced.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

EFFECTS OF THE INVENTION

In accordance with the method of manufacturing a photoelectric converting device according to the present invention, airtightness of a housing space for photocathode can be sufficiently maintained without degradation of the characteristics of the photocathode.

BRIEF DESCRIPTION OF THE DRAWINGS

FIG. 8 is a table showing specifications of a plurality of samples (sample 1 to sample 5) obtained according to the manufacturing method according to the present invention together with comparative examples (comparative example 1 and comparative example 2).

DESCRIPTION OF THE REFERENCE NUMERALS

Figure 1:
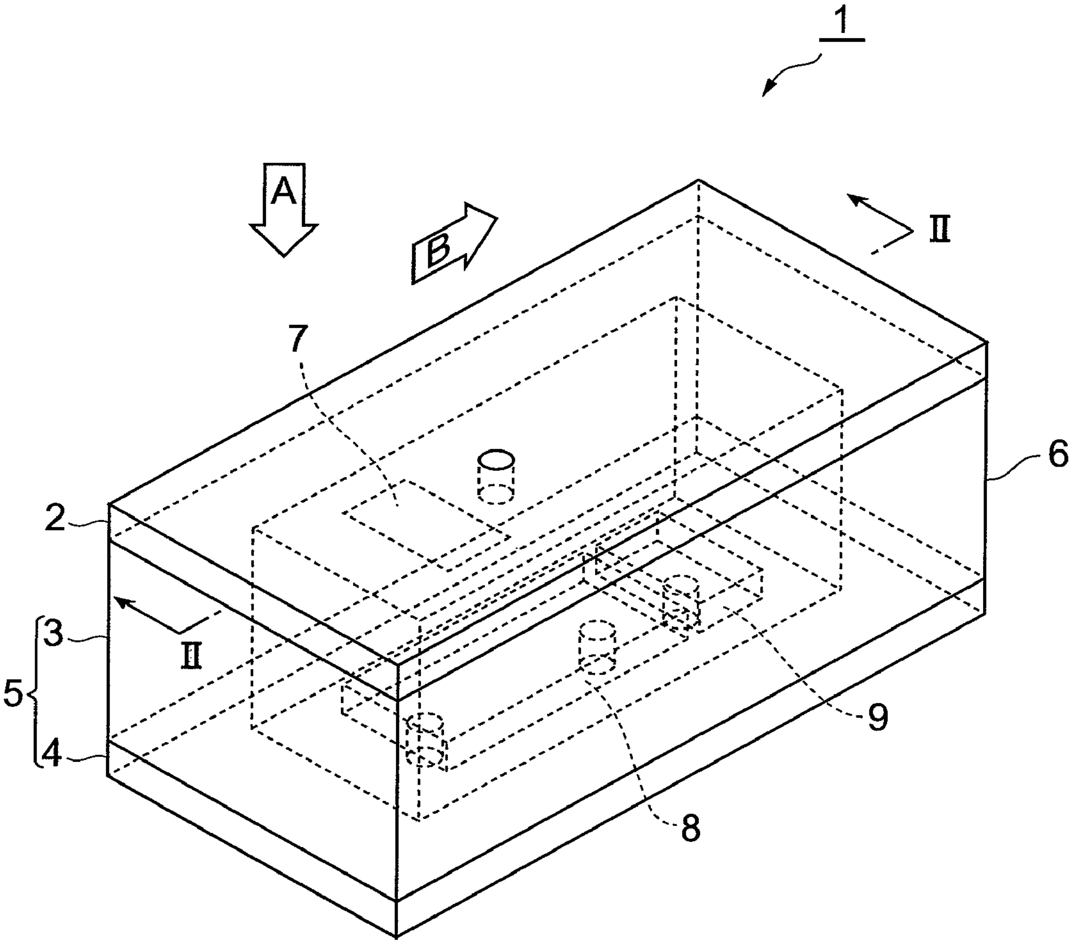
FIG. 1 is a perspective view showing a construction of an embodiment of a method of manufacturing a photoelectric converting device according to the present invention.

1 . . . photo multiplier tube; 2 . . . upper frame (second frame); 2*r* . . . flat surface; 3 . . . side wall; 4 . . . tabular member; 4*r* . . . inner surface (flat surface); 5 . . . lower frame; 6 . . . envelope; 7 . . . photocathode; 9 . . . anode; 10, . . . multilayered metal film; 10*a*, 10*b*, 11*a*, 11*b* . . . metal film; 12, 112 . . . bonding layer; 25, 33 . . . divided region; 30 . . . glass substrate (first substrate); 32 . . . glass substrate (second substrate); S . . . silicon wafer (third substrate); and W . . . bonding wire member (bonding material).

BEST MODES FOR CARRYING OUT THE INVENTION

In the following, embodiments of a method of manufacturing a photoelectric converting device according to the present invention will be explained in detail with reference to FIGS. 1 to 8. In the explanation of the drawings, constituents identical to each other will be referred to with numerals identical to each other without repeating their overlapping descriptions. The drawings are prepared for description, and are drawn so that the portions to be described are especially emphasized. Therefore, the dimensional ratios of the members in the drawings are not always the same as actual ratios.

Figure 2:
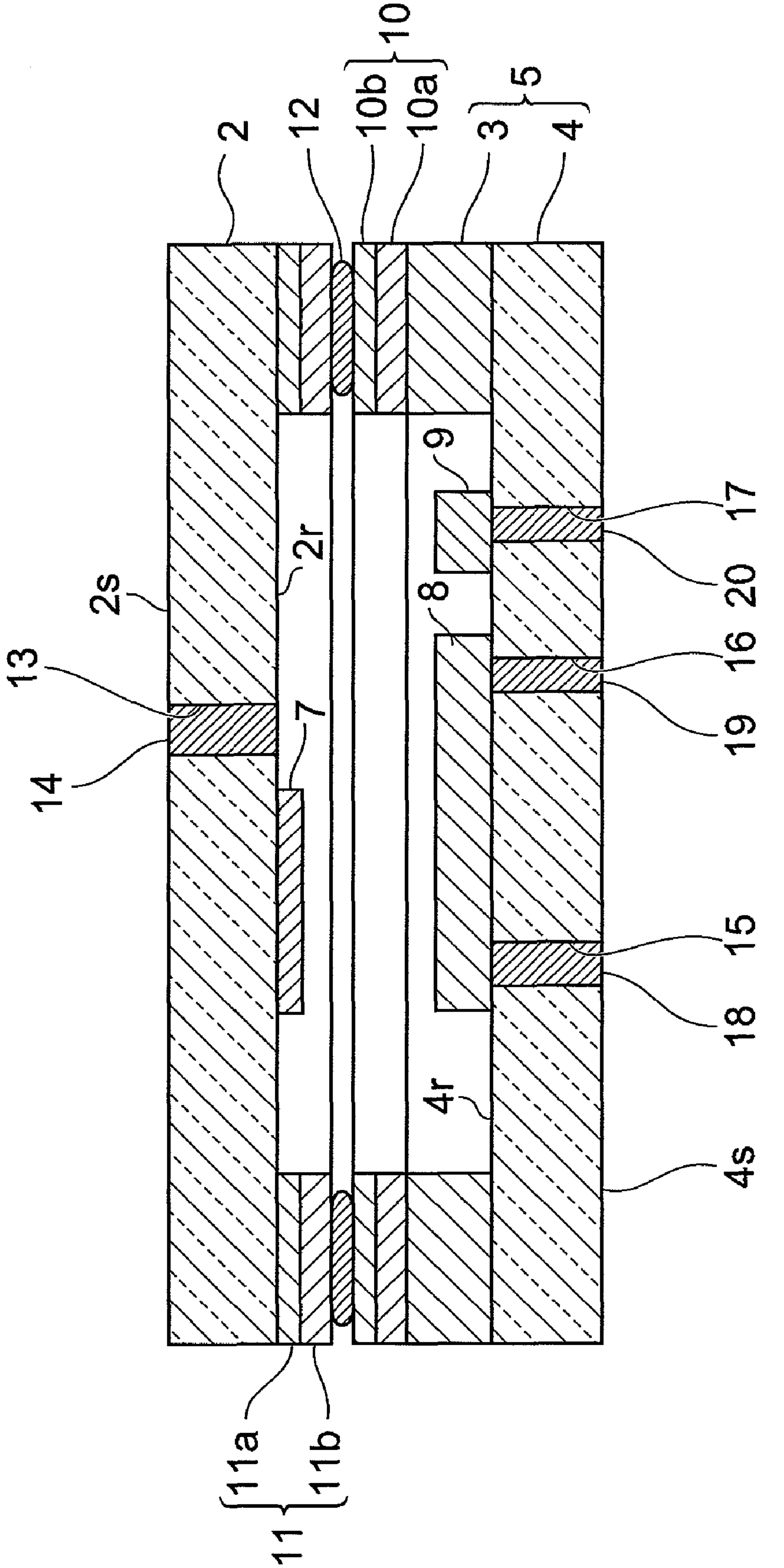
FIG. 2 is a sectional view along the line II-II of the photoelectric converting device shown in FIG. 1.

FIG. 1 is a perspective view showing a construction of an embodiment of the method of manufacturing a photoelectric converting device according to the present invention. As shown in this FIG. 1, the photoelectric converting device functions similar to a transmission-type electron multiplier tube, and comprises an envelope 6, a photocathode 7, an electron multiplier section 8, and an anode 9 which are housed inside the envelope 6. The envelope 6 is constituted by an upper frame 2 and a lower frame 5 bonded to each other. The lower frame 2 comprises a side wall 3 and a tabular member 4, and the upper frame 5 itself is a tabular member. In this photoelectric converting device 1, the photocathode 7 and the electron multiplier section 8 are arranged in the internal space of the envelope 7 such that the incident direction of light onto the photocathode 7 and the electron traveling direction at the electron multiplier section 8 cross each other. In other words, in the photoelectric converting device 1, when light is made incident from the direction indicated by the arrow A in FIG. 1, photoelectrons emitted from the photocathode 7 reach the electron multiplier section 8 and the photoelectrons travel in the direction indicated by the arrow B, and accordingly, secondary electrons are cascade-multiplied. FIG. 2 is a sectional view along the line II-II of the photoelectric converting device 1 shown in FIG. 1, and hereinafter, the components will be described in detail.

As shown in FIG. 2, the upper frame 2 itself and the tabular member 4 of the lower frame 5 are both rectangular glass-made flat plates. At least a part of the upper frame 2 functions as a light entrance window which transmits light made incident from the outside toward the photocathode 7. The lower frame 5 comprises a side wall 3 that is a silicon-made frame member in a hollow quadrangular prism shape. The side wall 3 is stood on the tabular member 4 parallel to four sides of a flat surface positioned on the inner side of (side facing the internal space of the envelope 6) of the tabular member 4 along the surrounding of the flat surface. Therefore, the side wall 3 constitutes a part of the housing space for housing the electron multiplier section 8 and the anode 9 inside the envelope 6. The side wall 3 and the tabular member 4 are firmly bonded to each other by anode bonding without arranging a bonding member. By this process, even when the lower frame 5 is placed in a high-temperature environment at the time of manufacturing, the lower frame 5 is not influenced by the heat.

On the upper end face of the side wall 3 of the lower frame 5, a multilayered metal film 10 is formed. The multilayered metal film 10 is obtained by laminating a metal film 10*a* comprised of chromium and a metal film 10*b* comprised of nickel in order toward the upper frame 2. Similarly, on the surrounding of the flat surface 2*r* on the inner side of the upper frame 2, that is, bonding portion of the upper frame 2 facing the side wall 3 when the upper frame 2 and the lower frame 5 are bonded to each other, a multilayered metal film 11 is also formed. The multilayered metal film 11 is obtained by laminating a metal film 11*a* comprised of chromium and a metal film 11*b* comprised of nickel metal in order toward the lower frame 5. The metal film 10*a* (chromium) has a film thickness of 50 nm, and the metal film 10*b* (nickel) has a film thickness of 500 nm. In addition, the metal film 11*a* (chromium) has a film thickness of 50 nm, and the metal film 11*b* (nickel) has a film thickness of 500 nm.

These lower frame 5 and the upper frame 2 are bonded to each other by sandwiching a bonding material containing indium (In) (for example, In, an alloy of In and Sn, an alloy of In and Ag or the like) between the multilayered metal film 10 and the multilayered metal film 11, and the inside is maintained airtightly. Herein, in FIG. 2, a bonding layer 12 compressed and deformed by pressurizing the linear bonding materials between the lower frame 5 and the upper frame 2 are shown. By bonding the multilayered metal film 10 and the multilayered metal film 11 via the bonding layer 12, airtight sealing of the inside of the envelope 6 is maintained. The bonding materials to be used are not limited to the linear materials, and materials processed in layer forms on the multilayered metal film 10 or the multilayered metal film 11 may also be applied.

On the inner surface 2*r* of the upper frame 2 of the above-described envelope 6, a transmission-type photocathode 7 which emits photoelectrons toward the internal space of the envelope 6 in response to incident light transmitted through the upper frame 2 is formed. The photocathode 7 is formed along the inner surface 2*r* on the left end side in the longitudinal direction (left-right direction of FIG. 2) of the inner surface 2*r* of the upper frame 2. In the upper frame 2, a hole 13 penetrating from the surface 2*s* through the inner surface 2*r* is provided. In the hole 13, a photocathode terminal 14 is arranged, and the photocathode terminal 14 is electrically connected to the photocathode 7.

On the inner surface 4*r* of the tabular member 4 of the lower frame 5, an electron multiplier section 8 and an anode 9 are formed along the inner surface 4*r*. The electron multiplier section 8 has a plurality of wall portions stood so as to fit each other in the longitudinal direction of the tabular member 4, and between these wall portions, grooves are formed. On the side wall and bottom of the wall portion, a secondary electron emitting surface serving as a secondary electron emitting material is formed. The electron multiplier section 8 is arranged at a position facing the photocathode 7 inside the envelope 6. The anode 9 is provided at a position apart from this electron multiplier section 8. Further, in the tabular member 4, holes 15, 16, and 17 penetrating from the surface 4*s* through the inner surface 4*r* are respectively provided. A photocathode side terminal 18 is inserted in the hole 15, an anode side terminal 19 is inserted in the hole 16, and an anode terminal 20 is inserted in the hole 17, respectively. The photocathode side terminal 18 and the anode side terminal 19 are in electrical contact with the both ends of the electron multiplier section 8, respectively, and generate a potential difference in the longitudinal direction of the tabular member 44 when a predetermined voltage is applied. The anode terminal 20 is in electrical contact with the anode 9, and extracts electrons that have reached the anode 9 to the outside.

Operations of the photoelectric converting device 1 having the above-described structure will be explained. At the time that light is made incident on the photocathode 7 transmitting through the upper frame 2, photoelectrons are emitted inside from the photocathode 7 toward the lower frame 5. The emitted photoelectrons reach the electron multiplier section 8 one end of which faces the photocathode 7. In the longitudinal direction of the electron multiplier section 8, a potential difference occurs due to application of a voltage to the photocathode side terminal 18 and the anode side terminal 19, such that photoelectrons which have reached the electron multiplier section 8 generate secondary electrons while colliding with the side wall and bottom portion of the electron multiplier section 8. Then, these secondary electrons reach the anode 9 while being cascade-multiplied. The generated secondary electrons are extracted as a signal to the outside from the anode 9 via the anode terminal 20.

Next, a method of manufacturing a photoelectric converting device according to the present invention will be explained with reference to FIGS. 3 to 6.

Figure 3:
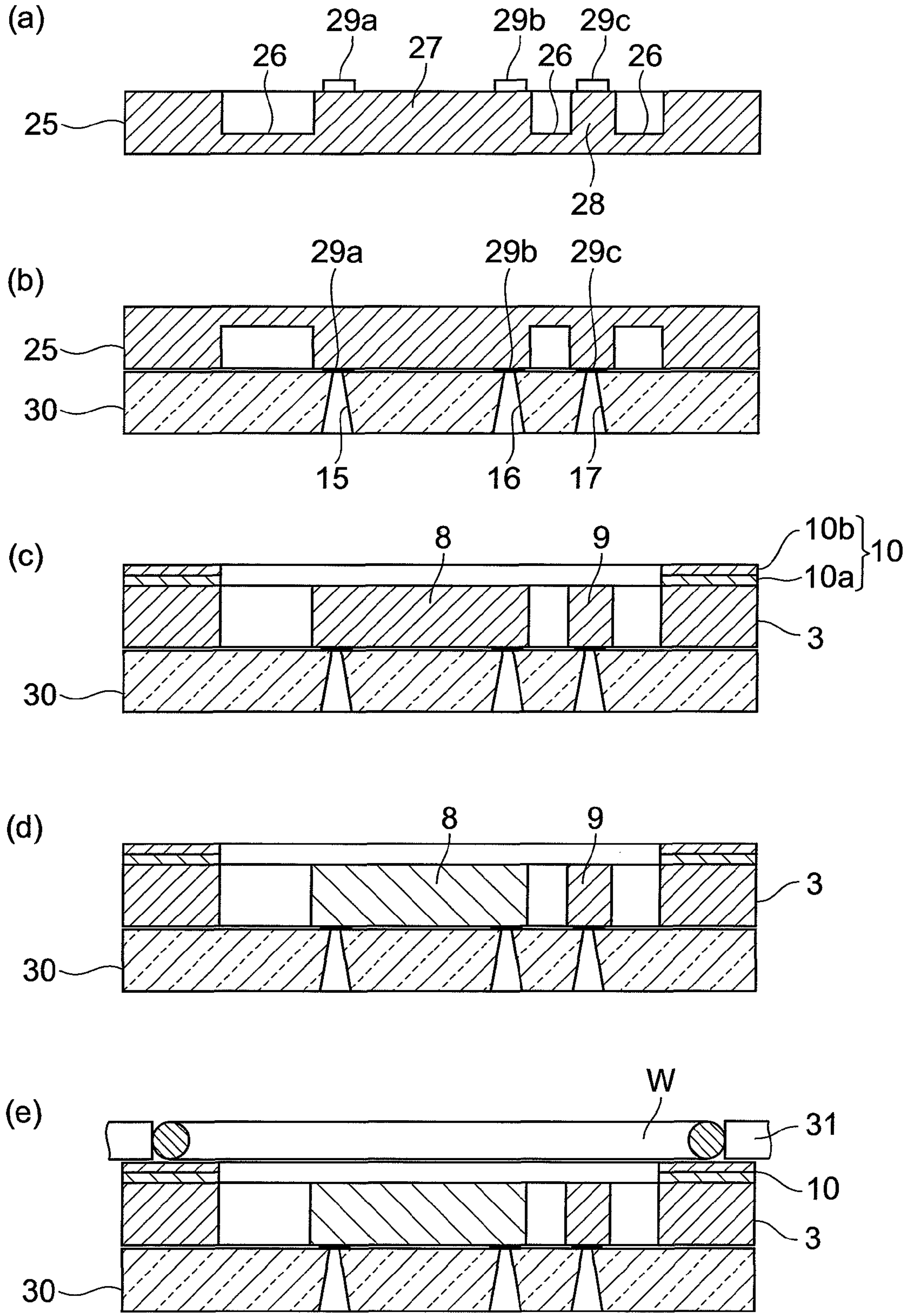
FIG. 3 shows sectional views for explaining the method of manufacturing a photoelectric converting device shown in FIG. 1.

First, a method of manufacturing the lower frame 5 comprising the side wall 3 and the tabular member 4 will be explained with reference to FIG. 3. FIG. 3 shows detailed drawings focusing on the portion corresponding to one lower frame 5. First, a 4-inch silicon wafer (third substrate) is prepared. Two terminals 29*a* and 29*b* for the electron multiplier section 8 and a terminal 29*c* for the anode 9 are formed by aluminum patterning on the surface of a rectangular divided region 25 on this silicon wafer. Thereafter, recessed portions 26 are processed by reactive ion etching (RIE) such that rectangular parallelepiped island portions 27 and 28 are formed on the surface including the terminals 29*a* and 29*b* and the surface including the terminal 29*c*, respectively (area (a) of FIG. 3).

Next, a glass-made substrate (first substrate) 30 provided in advance with holes 15, 16, and 17 for inserting terminals is prepared. Then, the divided region 25 of the silicon wafer and the substrate 30 are anodically bonded to each other while sandwiching the terminals 29*a*, 29*b*, and 29*c* (area (b) of FIG. 3). Herein, for reducing the influence of thermal expansion, it is preferable that a glass material consisting of the substrate

30 has the same level of thermal expansion coefficient as that of the silicon wafer on which side walls 3 are formed.

Thereafter, by RIE processing, the recesses 26 (see area (a) of FIG. 3) around the island portions 27 and 28 are made to penetrate to the surface of the divided region 25. By this process, the island portions 27 and 28 become an electronic multiplier section 8 and an anode 9, respectively, and the peripheral edge portion of the divided region 25 becomes side wall 3 (area (c) of FIG. 3). At this time, the electron multiplier section 8 and the anode 9 are arranged in the space surrounded by the side wall 3 on the inner side of the lower frame 5. Then, after the region except for the edge portion of the surface of the divided region 25 is covered by a stencil mask, chromium is first deposited on the edge portion as a metal film 11*a*, and then nickel is deposited as a metal film 10*b*. By the thus deposited metal films 10*a* and 10*b* in order, the multilayered metal film 10 is formed on the edge portion of the surface of the divided region 25 (area (c) of FIG. 3).

After the electron multiplier section 8, the anode 9, and the side wall 3 are formed, on side walls and bottom portion of the wall portions of the electron multiplier section 8, secondary electron emitting surfaces are formed (area (d) of FIG. 3). The secondary electron emitting surfaces are obtained by depositing Sb and MgO, etc., by using a mask and then introducing an alkali metal into these Sb, MgO, etc.

Next, after the environmental temperature is lowered from the secondary electron emitting surface manufacturing temperature to a normal temperature (about 25 to 30° C.), bonding wire members W for bonding to the upper frame 2 are arranged along the edge portion of the divided region 25 on the surface of the multilayered metal film 10 as a bonding portion (area (e) of FIG. 3). The bonding wire members W are arranged by using a jig 31. As the bonding wire member W, in addition to an In wire material, a wire member containing wire materials such as an alloy of In and Sn, an alloy of In and Ag, or the like with a diameter of, for example, 0.5 millimeters is used.

Figure 4:
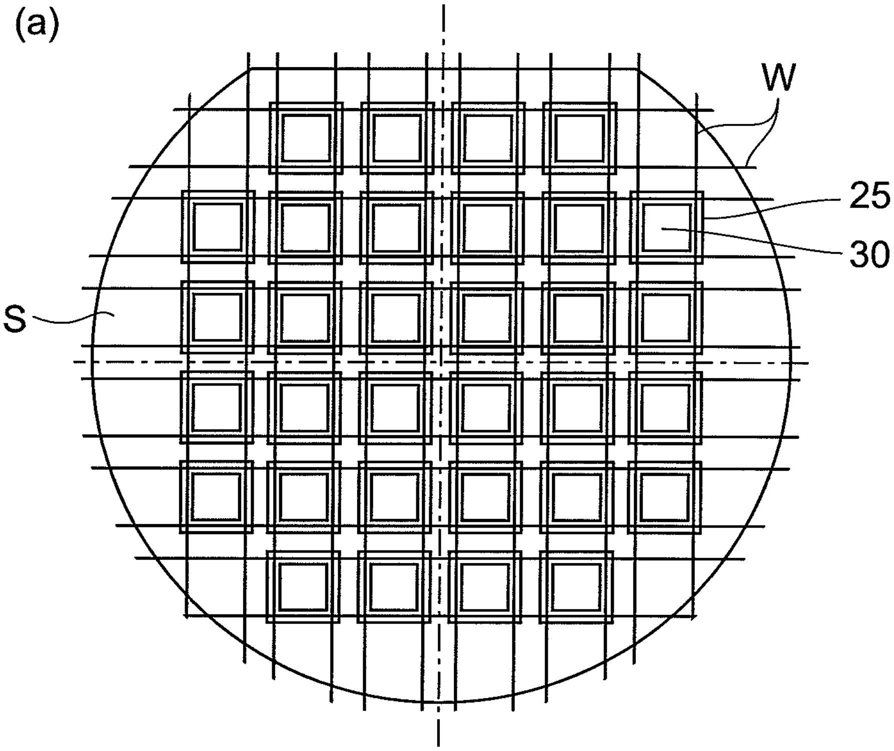
FIG. 4 shows a view (area (a)) showing arrangement of lower frames processed on a silicon wafer, and an enlarged view (area (b)) showing arrangement of bonding wire members for one of the divided regions shown in the area (a)
Figure 4:
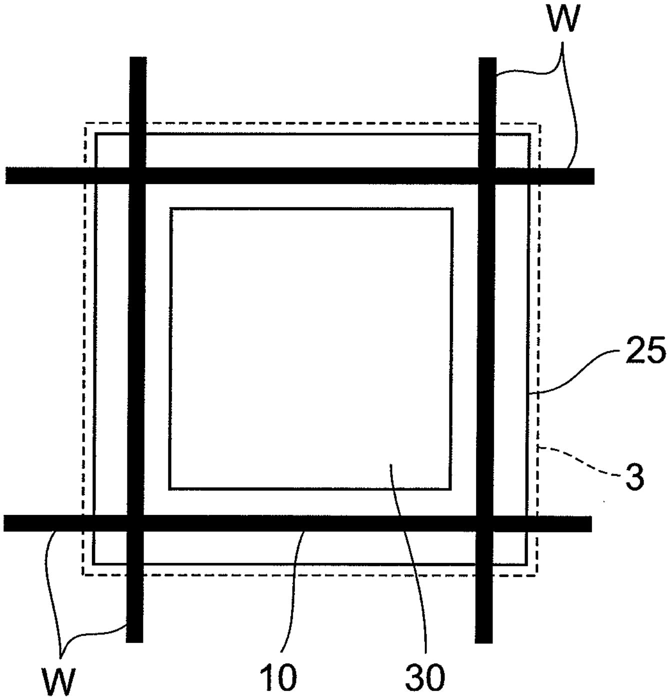

The manufacturing process of the lower frame 5 described above is performed for each of the plurality of divided regions 25 of the silicon wafer. In FIG. 4, the area (a) is a drawing showing arrangement of lower frames 5 processed on a silicon wafer S, and the area (b) is an enlarged view showing arrangement of bonding wire members W in one of the divided regions 25 shown in the area (a). However, in the areas (a) and (b) of FIG. 4, for simplifying the drawings, the electron multiplier sections 8 and the anodes 9 are not shown. As shown in the areas (a) and (b), the side wall 3 and the multilayered metal film 10 are formed in each of the plurality of divided regions 25 two-dimensionally aligned on the silicon wafer S. To the back side of the silicon wafer S, a glass-made substrate 30 is bonded. In other words, the side wall 3 is arranged so as to surround the flat surface of the glass substrate 30 in the divided region 25. The portion of the glass substrate 30 corresponding to the divided region 25 of the silicon wafer S corresponds to the tabular member 4. On the inner side of each divided region 25 on the glass substrate 30, the electron multiplier section 8 and the anode 9 are arranged (not shown). Furthermore, the bonding wire members W are placed like a mesh along the multilayered metal film 10 formed on the edge portion of the plurality of divided regions 25 on the silicon wafer S.

Figure 5:
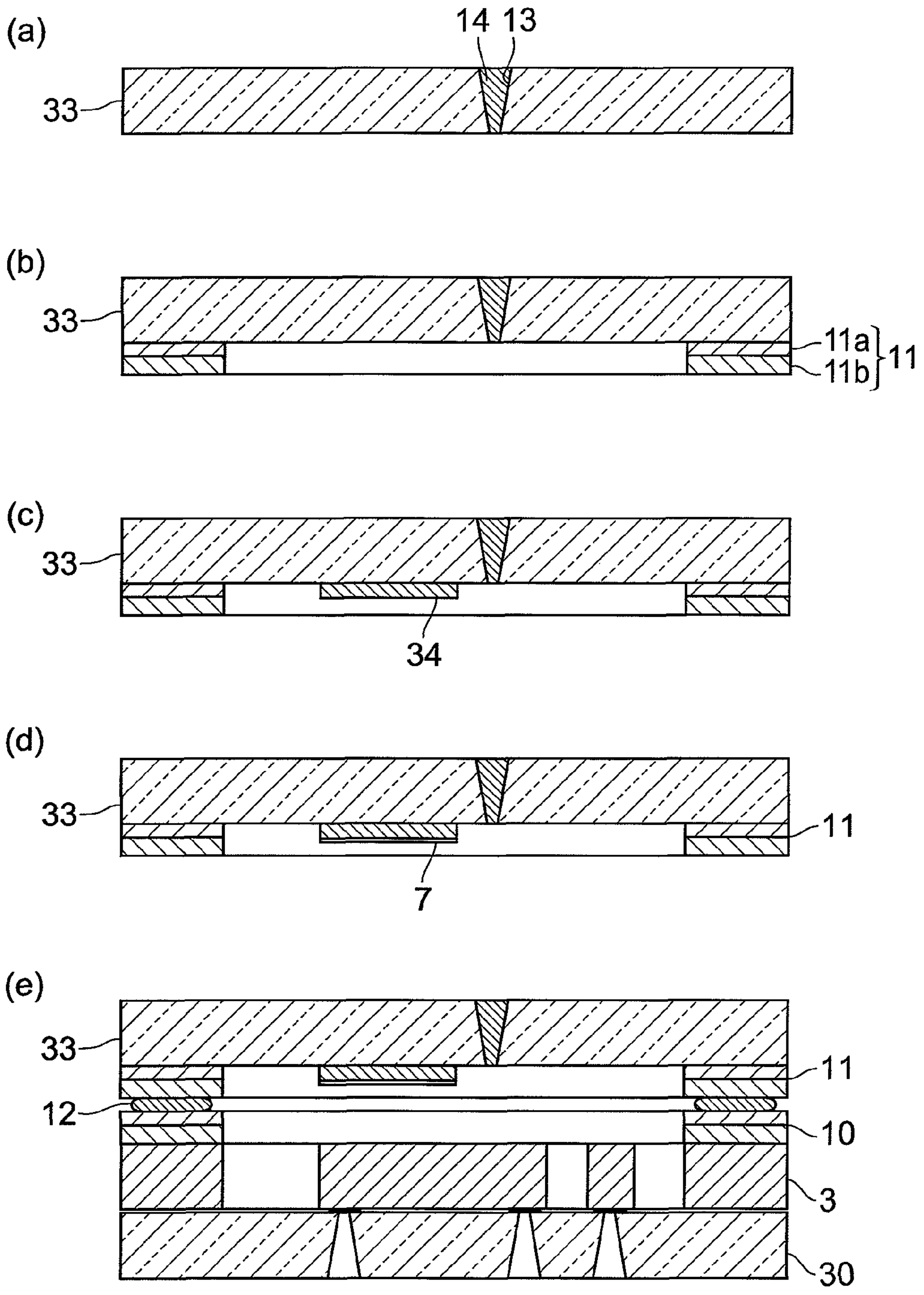
FIG. 5 shows sectional views for explaining a method of manufacturing the photoelectric converting device shown in FIG. 1.

Hereinafter, a method of manufacturing the upper frame 2 will be explained with reference to FIG. 5. FIG. 5 shows detailed drawings focusing on a portion corresponding to one upper frame 2 similar to FIG. 3.

First, a glass-made substrate (second substrate) 32 is prepared. On the outer surface of a rectangular divided region 33 corresponding to the above-described divided region 25, a terminal (not shown) for the photocathode 7 is formed by aluminum patterning. In this substrate 32, a hole 13 for embedding a metal electrode is formed in advance in each divided region by means of etching or blasting. By filling a metal electrode in the hole 13, a photocathode terminal 14 is embedded in the hole 13 (area (a) of FIG. 5).

Next, at portion along the periphery of the inner surface of the divided region 33 as a bonding portion to the side wall 3 of the lower frame 5, a multilayered metal film 11 is formed (area (b) of FIG. 5). The multilayered metal film 11 is obtained by depositing a metal film 11*a* comprised of chromium and then depositing a metal film 11*b* comprised of nickel on the metal film 11*a*. In the construction in which a side wall is provided on the bonding portion of the upper frame 2, the multilayered metal film 11 is formed on the side wall end face.

After the multilayered metal film 11 is formed, at the central portion of the inner surface on the divided region 33, a photocathode material 34 containing antimony (Sb) is deposited by using a mask (area (c) of FIG. 5). Thereafter, an alkali metal is introduced into the photocathode material 34, whereby the photocathode 7 is obtained (area (d) of FIG. 5). As a result, the photocathode 7 is arranged in the space on the inner side of the upper frame 2.

Figure 6:
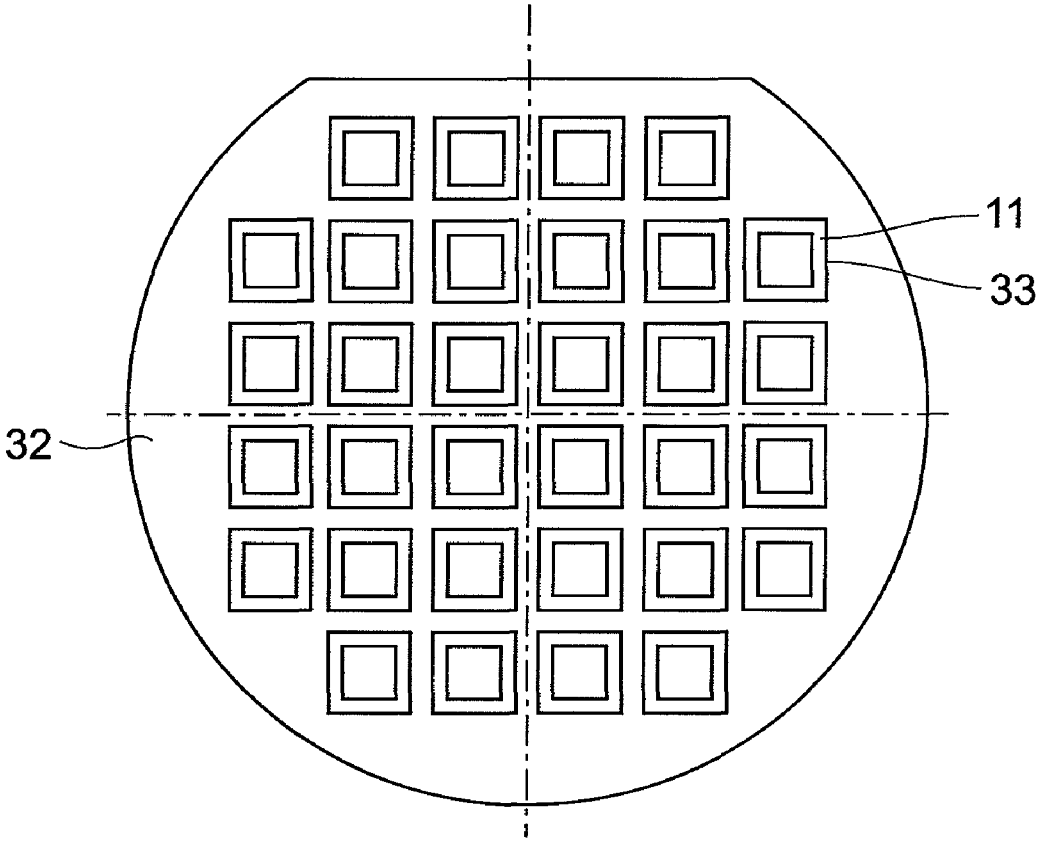
FIG. 6 is a drawing showing arrangement of upper frames processed on a glass substrate.

The above-described manufacturing process of the upper frame 2 is performed for each of the plurality of divided regions 33 on the glass substrate. FIG. 6 is a drawing showing arrangement of upper frames 2 processed on the glass substrate 32. However, in FIG. 6, for simplifying the drawing, the photocathodes 7 are not shown. As shown in this FIG. 6, the multilayered metal film 11 and the photocathode 7 are formed in each of the plurality of divided regions 33 two-dimensionally aligned on the glass substrate 32. Therefore, the multilayered metal film 11 is arranged so as to surround the flat surface of the glass substrate 32 in the divided region 33. Each divided region 33 on the glass substrate 32 corresponds to the upper frame 2.

Thereafter, in a vacuum space in which the environmental temperature was lowered from the manufacturing temperature of the photocathode 7 or the secondary electron emitting surface to a normal temperature (about 25 to 30° C.) as described above (for example, internal space of a vacuum transfer apparatus decompressed to a predetermined degree of vacuum), the silicon wafer S and the glass substrate 32 are superimposed on each other. At this time, the silicon wafer S and the glass substrate 32 are superimposed on each other such that the plurality of divided regions 25 and the plurality of divided regions 33 face each other correspondingly, that is, the multilayered metal film 11 as a bonding portion of the upper frame 2 and the multilayered metal film 10 formed on the end face of the side wall 3 of the lower frame 5 face each other. At this time, the bonding wire members W are arranged between the multilayered metal film 10 and the multilayered metal film 11. Thereafter, while keeping the normal temperature not more than the melting point of indium, the silicon wafer S and the glass substrate 32 are pressure-bonded in the vacuum space to each other while sandwiching the bonding wire members W. At this time, the bonding wire members W deform to be a bonding layer 12 with a thickness of about 0.15 millimeters in close contact with the multilayered metal films 10 and 11, whereby the upper frame 2 and the lower frame 5 are bonded to each other in a wide range (area (e) of FIG. 5). The pressure bonding of the upper frame 2 and the lower frame 5 can be realized by gradually lowering the degree of vacuum inside the vacuum transfer apparatus, that is, by increasing the atmospheric pressure difference between the vacuum transfer apparatus and the internal space defined by the upper frame 2 and the lower frame 5 (internal space of the photoelectric converting device 1). The upper frame 2 and the lower frame 5 can also be pressure-bonded by applying a predetermined weight to the upper frame 2 superimposed on the lower frame 5 inside the vacuum transfer apparatus. Further, the upper frame 2 and the lower frame 5 can also be pressure-bonded by pressing the upper frame 2 and the lower frame 5 against each other with a predetermined pressure by using a pressurizing jig inside the vacuum transfer apparatus. The pressure to be applied between the silicon wafer S and the glass substrate 32 when pressure-bonding these is, for example, 100 kg per one chip. By this process, the upper frame 2 and the lower frame 5 are reliably vacuum-sealed. Lastly, the silicon wafer S and the glass substrate 32 are diced along the side wall 3 forming the boundaries of the divided regions 25 and 33 while bonded to each other for each divided region 25, 33. Accordingly, a photoelectric converting device 1 including an envelope 6 composed of the upper frame 2 and the lower frame 5 is obtained.

In accordance with the above-described method of manufacturing the photoelectric converting device 1, on the end face of the side wall 3 provided on the periphery of the divided region 25 of the silicon wafer S, a multilayered metal film 10 in which a chromium film and a nickel film are laminated in order is formed, and on the other hand, on a bonding portion of the glass substrate 32 facing the end face of the side wall 3, a multilayered metal film 11 with the same composition is laminated. In the space on the inner side of the silicon wafer S or the glass substrate 32, photocathodes 7, electron multiplier sections 8, and anodes 9 are arranged corresponding to the respective divided regions 25, 33, and then the silicon wafer S and the glass substrate 32 are introduced into a vacuum space at a normal temperature not more than the melting point of indium. Then, inside this vacuum space, the silicon wafer S and the glass substrate 32 are pressure-bonded to each other in a state where bonding wire members W containing indium are sandwiched between the side wall 3 of the silicon wafer S and the bonding portion of the glass substrate 32. Accordingly, the silicon wafer S and the glass substrate 32 are bonded to each other by pressing the bonding wire members in a normal temperature environment, and the bonding wire members hardly flow differently from the melting state, and fresh portions of the bonding wire members are easily exposed to the outside, such that reliable airtight sealing is possible with less influence on the internal structure. Further, the silicon wafer S and the glass substrate 32 are diced and divided for each envelope 6 while superimposed on each other.

In accordance with such a manufacturing process, without depending on the substrate material to be used, for example, even when the thermal expansion coefficients of the upper frame 2 and the side wall 3 of the lower frame are different from each other, the adhesion between the substrates via the multilayered metal films 10 and 11 and the bonding wire members W is increased. Therefore, the internal space of the envelope 6 obtained by dicing these substrates while bonded to each other is sufficiently maintained airtightly. In particular, when tabular members are processed by using a semiconductor process, the members for forming an envelope are increased in area such that deformation easily occurs. Therefore, the manufacturing method according to the present invention is especially effective. Furthermore, distortion of the envelope 6 due to the bonding temperature does not occur, such that the internal space of the photoelectric converting device 1 is sufficiently maintained airtightly. At the same time, heating is not applied after the photocathode 7 is formed, such that characteristic degradation of the photocathode 7 and generation of gases from the components can also be prevented.

The upper frame 2 is comprised of glass material, and a part of this functions as a light entrance window. Due to this construction, the formation of the light entrance window in the manufacturing process is simplified, and the harmonization between the upper frame and the multilayered metal film 11 is improved. This contributes to further improvement in airtightness of the internal space of the envelope 6. Further, with the high degree of freedom for material selection of the upper frame 2, it also becomes possible to properly set the transmitting wavelength range of the light entrance window.

The side wall 3 of the lower frame 5 is comprised of silicon material, such that the side wall 3 is easily processed. In addition, the adhesion between the lower frame 5 and the multilayered metal film 10 is high, such that the airtightness of the internal space of the envelope 6 is further improved.

The tabular member 4 of the lower frame 5 is comprised of glass material, such that the tabular member 4 and the side walls 3 are anodically bonded to each other. Therefore, the lower frame 5 can be easily manufactured. Even in a high-temperature state such as at the time of manufacturing secondary electron emitting surfaces on the lower frame 5, influence of distortion due to thermal expansion is reduced, such that the durability of the photoelectric converting device 1 is improved.

The present invention is not limited to the above-described examples. For example, the multilayered metal films 10 and 11 may be multilayered metal films in which a chromium film and a titanium film are laminated in order, or may be a metal film constituted by a titanium single layer. Even in this construction, the sealing of the upper frame 2 and the lower frame 5 can be sufficiently maintained.

Figure 7:
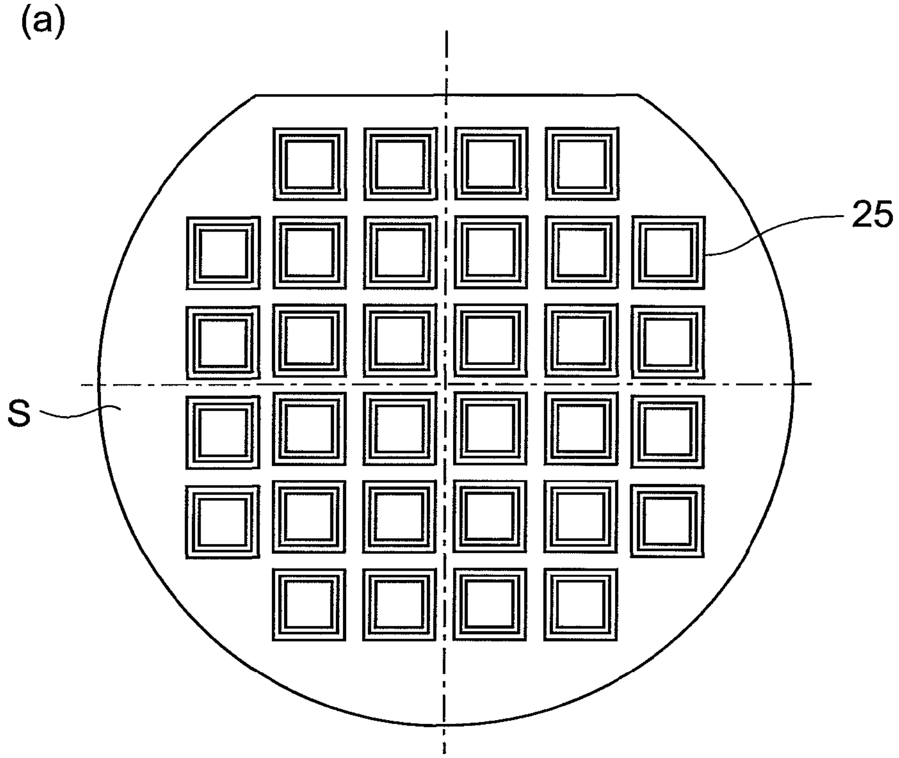
FIG. 7 shows a view (area (a)) showing arrangement of lower frames processed on a silicon wafer, and an enlarged view (area (b)) showing arrangement of a bonding layer of one of the divided regions shown in the area (a)
Figure 7:
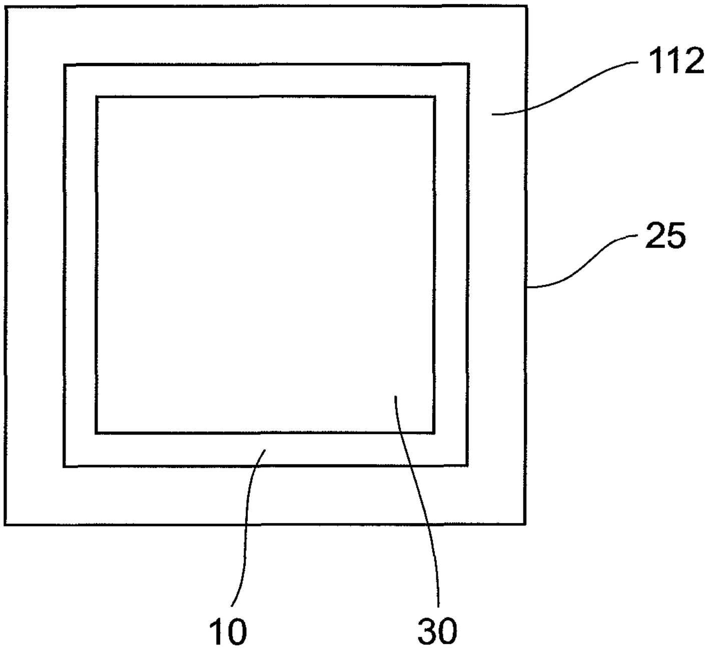

The bonding layer to be arranged between the multilayered metal films 10 and 11 may be formed like a film by means of screen printing or formed like a film by means of ink-jet or dot-matrix patterning on the multilayered metal film 11 of the upper frame 2 or the multilayered metal film 10 of the lower frame 5. In FIG. 7, the area (a) is a drawing showing arrangement of the lower frames 5 on the silicon wafer S, and the area (b) is an enlarged view showing arrangement of a bonding layer 112 formed by patterning on one of the divided regions 25 of the area (a). As shown in the areas (a) and (b) of FIG. 7, the bonding layers 112 are independently formed like frames in the respective divided regions 25 along the multilayered metal films 10 formed on the peripheries of the divided regions 25. This bonding layer 112 is formed at a predetermined distance from the inner periphery portion of the multilayered metal film 10 so as not to flow into the internal space of the envelope 6 when the upper frame 2 and the lower frame 5 are bonded to each other. An amount of the bonding material on the multilayered metal film 10 and a pressure to be applied for bonding are properly adjusted so as to prevent the bonding material from overflowing to the internal space of the envelope 6.

As the material of the upper frame 2 and the material of the tabular member 4 of the lower frame 5, quartz, heat-resistant glass such as Pyrex (trademark), bolosilicate, UW glass, sapphire glass, magnesium fluoride ($MgF_2$) glass, silicon, etc., can be used. As the material of the side wall 3, kovar, aluminum, stainless steel, nickel, ceramic, silicon, glass, or the like can be used.

The side wall 3 may be bonded to the upper frame 2 previous to the bonding between the upper frame 2 and the lower frame 5. It is also allowed that different side walls are bonded to the upper frame 2 and the lower frame 5, respectively. In this case, the multilayered metal films 10 and 11 are provided on end faces of the respective side walls. The side wall 3 is not limited to a member separate from the tabular member 4 of the lower frame 5 or the upper frame 2, and the side wall may be molded integrally with the tabular member 4 or the upper frame 2. The side walls 3 and the tabular member 5 may be bonded by a bonding material such as indium.

The photocathode 7 is not limited to the transmission-type photocathode provided on the upper frame 2, and may be a reflection-type photocathode provided on the lower frame 5.

Further, the electron multiplier section 8 and the anode 9 are not necessarily formed integrally with the side wall 3 from one silicon material, and members formed separately from the side wall 3 may also be applied.

FIG. 8 shows non-defective rates of a plurality of samples (samples 1 through 5) and comparative examples 1 and 2 of the photoelectric converting device 1 obtained according to the manufacturing method according to the present invention. The non-defective rates shown in FIG. 8 are judged based on whether the active state of the photocathode is maintained after the manufacturing process.

In detail, in the photoelectric converting device of sample 1, the upper frame 2 is comprised of glass material, and on a bonding portion of the upper frame 2, as the multilayered metal film 11, a chromium layer (metal film 11*a*) of 50 nm and a nickel layer (metal film 11*b*) of 500 nm are laminated in order. On the other hand, on the lower frame 5, the tabular member 4 is also comprised of glass material, and the side wall 3 is comprised of silicon material. On the end face of the side wall 3, as the multilayered metal film 10, a chromium layer (metal film 11*a*) of 50 nm and a nickel layer (metal film 11*b*) of 500 nm are laminated in order. As bonding wire members to be sandwiched between the multilayered metal films 10 and 11 when the upper frame 2 and the lower frame 5 are bonded to each other, wires comprised of indium material are applied. The non-defective rate of the photoelectric converting device of sample 1 constructed as described above was 6/6.

In the photoelectric converting device of sample 2, the upper frame 2 is comprised of glass material, and on a bonding portion of the upper frame 2, only a titanium layer of 300 nm is formed as the multilayered metal film 11 (having a single-layer structure in sample 2). On the other hand, on the lower frame 5, the tabular member 4 is also comprised of glass material, and the side wall 3 is comprised of silicon material. On end face of the side wall 3, only a titanium layer of 300 nm is also formed as the multilayered metal film 10 (having a single-layer structure in sample 2). As bonding wire members to be sandwiched between the multilayered metal films 10 and 11 when the upper frame 2 and the lower frame 5 are bonded to each other, wires comprised of indium material are applied. The non-defective rate of the photoelectric converting device of sample 2 constructed as described above was 2/2.

In the photoelectric converting device of sample 3, the upper frame 2 is comprised of glass material, and on a bonding portion of the upper frame 2, as the multilayered metal film 11, a chromium layer (metal film 11*a*) of 50 nm and a nickel layer (metal film 11*b*) of 500 nm are laminated in order. On the other hand, on the lower frame 5, the tabular member 4 is comprised of silicon material, and the side wall 3 is also comprised of silicon material. On end face of the side wall 3, as the multilayered metal film 10, a chromium layer (metal film 11*a*) of 50 nm and a nickel layer (metal film 11*b*) of 500 nm are laminated in order. As bonding wire members to be sandwiched between the multilayered metal films 10 and 11 when the upper frame 2 and the lower frame 5 are bonded to each other, wires comprised of indium material are applied. The non-defective rate of the photoelectric converting device of sample 3 constructed as described above was 2/2.

In the photoelectric converting device of sample 4, the upper frame 2 is comprised of glass material, and on a bonding portion of the upper frame 2, as the multilayered metal film 11, a chromium layer (metal film 11*a*) of 300 nm and a titanium layer (metal film 11*b*) of 30 nm are laminated in order. On the other hand, on the lower frame 5, the tabular member 4 is also comprised of glass material, and a side wall 3 is comprised of silicon material. On the end face of the side wall 3, as the multilayered metal film 10, a chromium layer (metal film 11*a*) of 300 nm and a titanium layer (metal film 11*b*) of 30 nm are laminated in order. As bonding wire members to be sandwiched between the multilayered metal films 10 and 11 when the upper frame 2 and the lower frame 5 are bonded to each other, wires comprised of indium material are applied. The non-defective rate of the photoelectric converting device of sample 4 constructed as described above was 3/3.

In the photoelectric converting device of sample 5, the upper frame 2 is comprised of glass material, and on a bonding portion of the upper frame 2, as the multilayered metal film 11, a chromium layer (metal film 11*a*) of 300 nm and a nickel layer (metal film 11*b*) of 500 nm are laminated in order. On the other hand, on the lower frame 5, the tabular member 4 is comprised of silicon material, and a side wall 3 is also comprised of silicon material. On the end face of the side wall 3, as the multilayered metal film 10, a chromium layer (metal film 11*a*) of 300 nm and a nickel layer (metal film 11*b*) of 500 nm are laminated in order. As bonding wire members to be sandwiched between the multilayered metal films 10 and 11 when the upper frame 2 and the lower frame 5 are bonded to each other, wires comprised of indium material are applied. The non-defective rate of the photoelectric converting device of sample 5 constructed as described above was 10/10.

As compared with samples 1 through 5 constructed as described above, in the photoelectric converting device of comparative example 1, the upper frame is comprised of glass material, and on a bonding portion of the upper frame, a titanium layer of 30 nm, a platinum layer of 20 nm, and a gold layer of 1000 nm are laminated in order. On the other hand, on the lower frame, the tabular member is also comprised of glass material, and the side wall is comprised of silicon material. On the end face of the side wall, a titanium layer of 30 nm, a platinum layer of 20 nm, and a gold layer of 1000 nm are also laminated in order. As bonding wire members to be sandwiched between the multilayered metal films having the three-layer structures when the upper frame and the lower frame are bonded to each other, wires comprised of indium material are applied. The non-defective rate of the photoelectric converting device of comparative example 1 constructed as described above was 0/6.

In the photoelectric converting device of comparative example 2, the upper frame is comprised of glass material, and on a bonding portion of the upper frame, no metal film is formed. On the other hand, on the lower frame, the tabular member is also comprised of glass material, and the side wall is comprised of silicon material. No metal film is formed on end face of the side wall, either. As bonding wire members to be sandwiched between the multilayered metal films having the three-layer structures, wires comprised of indium material are applied. The non-defective rate of the photoelectric converting device of comparative example 2 constructed as described above was 0/4.

As described above, the photoelectric converting devices of samples 1 through 5 and comparative examples 1 and 2 are examples in which bonding wire members (wires) containing In are arranged on the lower frame 5. In samples 2 and 4, the compositions of the multilayered metal films 10 and 11 are changed from those of samples 1. In sample 3, the material of the tabular member 4 of the lower frame 5 is changed from that of samples 1 and 2. Further, in sample 5, the film thicknesses of the multilayered metal films 10 and 11 are changed from those of sample 3. On the other hand, in comparative example 1, the multilayered metal films 10 and 11 are replaced with compositions other than the multilayered metal film in which chromium and nickel are laminated in order, the multilayered metal film in which chromium and titanium are laminated in order, or the single-layer metal film of titanium. In comparative example 2, the multilayered metal films 10 and 11 are not formed. The compositions of the multilayered metal films shown in FIG. 8 mean that the multilayered metal films are deposited in the described order on the upper frame or lower frame, and the values in parentheses of the chemical symbols indicate the film thicknesses (nanometers) thereof.

From the above-described evaluation results, it was confirmed that in Samples 1 through 5 in which metal layers of a combination of chromium and nickel, a combination of chromium and titanium, or only titanium were applied to the multilayered metal films 10 and 11, and bonding wire members of indium were sandwiched between the multilayered metal films 10 and 11, the non-defective rate was as remarkably high as 100 percent regardless of the material of the lower frame. On the other hand, in comparative example 1 having multilayered metal films with other compositions or comparative example 2 having no multilayered metal films, the non-defective rate was lowered to 0 percent.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

The method of manufacturing a photoelectric converting device according to the present invention is applicable to manufacturing various sensor envelopes which are required to maintain airtightness sufficient in practical use.

The invention claimed is:

1. A method of manufacturing a photoelectric converting device comprising an envelope constituted by bonding a first frame, which includes a tabular member and a side wall provided on a main surface of said tabular member so as to surround a center of the main surface and extend along a vertical direction from said main surface, and a second frame which includes a tabular member, said envelope having a light entrance window at least at a part thereof, and housing a photocathode and an anode in an internal space thereof defined by the main surface of said tabular member of said first frame, said side wall of said first frame, and the main surface of said tabular member of said second frame, comprising:

a first step of forming a first metal film on an end face of said side wall of said first frame which faces the main surface of said tabular member of said second frame, the first metal film including one of a metal film in which chromium and nickel are laminated in order along a vertical direction from the end face of said side wall, a metal film in which chromium and titanium are laminated in order in the vertical direction from the end face of said side wall, and a metal film comprised of titanium;

a second step of forming a second metal film directly or indirectly on a bonding portion on a surface of said tabular member of said second frame which faces an end face of said side wall of said first frame, the second metal film including one of a metal film in which chromium and nickel are laminated in order along the vertical direction from the surface of said tabular member, a metal film in which chromium and titanium are laminated in order along the vertical direction from the surface of said tabular member, and a metal film comprised of titanium;

a third step of arranging said photocathode and said anode in the internal space of said envelope, said third step forming each of said photocathode and said anode onto at least one of the main surface of said tabular member of said first frame and the main surface of said tabular member of said second frame;

a fourth step of introducing said first and second frames into a vacuum space decompressed to a predetermined degree of vacuum with a temperature not more than the melting point of indium, and making the end face of said side wall of said first frame and the bonding portion of said second frame face each other while a bonding material containing indium is sandwiched between the first metal film and the second metal film; and a fifth step of bonding said first frame and said second frame in the vacuum space, said fifth step making said first frame and said second frame be brought into close contact with each other with a predetermined pressure while sandwiching the bonding material.

2. A method according to claim 1, wherein at least one of said tabular member of said first frame and said tabular member of said second frame is comprised of glass material, and a part thereof functions as a light entrance window.

3. A method according to claim 1, wherein said side wall of said first frame is comprised of silicon material.

4. A method according to claim 1, wherein said tabular member of said first frame is comprised of glass material, and is anodically bonded to said side wall of said first frame.

5. A method of manufacturing a photoelectric converting device comprising an envelope constituted by bonding a first frame, which includes a tabular member and a side wall provided on a main surface of said tabular member so as to surround a center of the main surface and extend along a vertical direction from the main surface, and a second frame which includes a tabular member, said envelope having a light entrance window at least at a part thereof, and housing a photocathode and an anode in an internal space thereof defined by the main surface of said tabular member of said first frame, said side wall of said first frame, and the main surface of said tabular member of said second frame, comprising:

a first step of forming a plurality of frame structures each having the same structure as that of said first frame on a first substrate, said first step preparing said first substrate, forming a plurality of side walls, extending along a the vertical direction from a surface of said first substrate, on the surface of said first substrate so as to individually surround a plurality of divided regions allocated on the surface of said first substrate, and forming, on end faces of said formed side walls, one of a metal film in which chromium and nickel are laminated in order along a vertical direction from end faces of said side walls, a metal film in which chromium and titanium are laminated in order along the vertical direction from the end faces of said side walls, and a metal film comprised of titanium, as a first metal film;

a second step of forming a plurality of frame structures each having the same structure as that of said second frame on a second substrate, said second step preparing said second substrate, and forming, on each of a plurality of bonding portions on a surface of said second substrate which faces end faces of said side walls formed on the surface of said first substrate, one of a metal film in which chromium and nickel are laminated in order along a vertical direction from the surface of said second substrate, a metal film in which chromium and titanium are laminated in order along the vertical direction from the surface of said second substrate, and a metal film comprised of titanium, as a second metal film;

a third step of arranging a plurality of pairs each corresponding to a pair of said photocathode and said anode in an internal space of said associated envelope, said third step forming each pair of said photocathode and said anode onto at least one of the associated region on the surface of said first substrate and the associated region on the surface of said second substrate;

a fourth step of introducing said first and second substrates into a vacuum space decompressed to a predetermined degree of vacuum at a temperature not more than the melting point of indium, and making the end faces of said side walls on said first substrate and the bonding portions on the surface of said second substrate face each other while sandwiching a bonding material containing indium between the first metal film and the second metal film;

a fifth step of bonding said first substrate and said second substrate in the vacuum space, said fifth step making said first substrate and said second substrate be brought into close contact with each other with a predetermined pressure while sandwiching the bonding material; and a sixth step of obtaining a plurality of envelopes from said first and second substrates bonded to each other, said sixth step dicing said first and second substrates bonded to each other along said side walls positioned between said first and second substrates.

6. A method according to claim 5, wherein said first step includes a sub-step of preparing a third substrate and etching said third substrate into patterns serving as said side walls, and wherein said etched third substrate is anodically bonded to said first substrate such that said formed side walls surround the plurality of divided regions allocated on the surface of said first substrate.

* * * * *